(12) United States Patent
Uchida

(10) Patent No.: US 7,879,657 B2
(45) Date of Patent: Feb. 1, 2011

(54) SEMICONDUCTOR DEVICE AND MANUFACTURING METHOD THEREOF

(75) Inventor: Hidetsugu Uchida, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/155,610

(22) Filed: Jun. 20, 2005

(65) Prior Publication Data

US 2006/0079031 A1   Apr. 13, 2006

(30) Foreign Application Priority Data

Oct. 12, 2004   (JP)   ............... 2004-297072

(51) Int. Cl.
  *H01L 21/00*  (2006.01)
  *H01L 21/335*  (2006.01)

(52) U.S. Cl. ............... 438/150; 438/149; 117/8

(58) Field of Classification Search .......... 438/439
See application file for complete search history.

(56) References Cited

U.S. PATENT DOCUMENTS

| | | | | |
|---|---|---|---|---|
| 4,385,937 A | * | 5/1983 | Ohmura | 438/150 |
| 4,500,388 A | * | 2/1985 | Ohmura et al. | 117/8 |
| 4,559,102 A | * | 12/1985 | Hayafuji | 117/45 |
| 4,565,584 A | * | 1/1986 | Tamura et al. | 117/8 |
| 4,592,799 A | * | 6/1986 | Hayafuji | 117/45 |
| 4,808,546 A | * | 2/1989 | Moniwa et al. | 438/166 |
| 4,874,718 A | * | 10/1989 | Inoue | 438/481 |
| 5,134,090 A | * | 7/1992 | Bean et al. | 438/492 |
| 6,680,240 B1 | * | 1/2004 | Maszara | 438/455 |
| 6,686,255 B2 | * | 2/2004 | Yang et al. | 438/439 |
| 6,902,962 B2 | * | 6/2005 | Yeo et al. | 438/150 |
| 6,919,238 B2 | * | 7/2005 | Bohr | 438/166 |
| 7,122,452 B2 | * | 10/2006 | Pawlak | 438/528 |
| 2002/0168837 A1 | * | 11/2002 | Hsu et al. | 438/517 |
| 2005/0087842 A1 | * | 4/2005 | Forbes | 257/617 |
| 2006/0094212 A1 | * | 5/2006 | Noguchi et al. | 438/481 |

FOREIGN PATENT DOCUMENTS

JP   2001-267577   9/2001

* cited by examiner

*Primary Examiner*—Steven Loke
*Assistant Examiner*—David Goodwin
(74) *Attorney, Agent, or Firm*—Volentine & Whitt, P.L.L.C.

(57) ABSTRACT

An insulating film layer is formed between a channel region of an MOS element formed in a monocrystal silicon layer of an SOS substrate in which the monocrystal silicon layer is laminated on a sapphire substrate, and the sapphire substrate, thereby to bring a stress state of the monocrystal silicon layer on the insulating film layer into a tensile stress state.

13 Claims, 4 Drawing Sheets

SEMICONDUCTOR DEVICE AND MANUFACTURING METHOD THEREOF

BACKGROUND OF THE INVENTION

1. Field of the Invention

The present invention relates to a semiconductor device using an SOS (Silicon On Sapphire) substrate and a manufacturing method thereof.

2. Description of the Related Art

A conventional semiconductor device is one of such a type that when a semiconductor element having a CMOS (Complementary MOS (Metal Oxide Semiconductor)) structure is formed in a monocrystal silicon layer of an SOS substrate, an insulating film layer constituted of a silicon oxide film is provided between a sapphire substrate and the monocrystal silicon layer, and a P channel MOS element (called "pMOS element") is formed in monocrystal silicon on the insulating film layer thereby to prevent diffusion of aluminum from the sapphire ($Al_2O_3$) substrate to enhance off leak characteristics, whereas an N channel MOS element (called "nMOS element") is formed in its corresponding monocrystal silicon layer directly formed in the sapphire substrate, and P-type concentration of a channel region of the nMOS element, corresponding to a P type diffusion layer is enhanced by aluminum corresponding to a P type impurity diffused from the sapphire substrate to improve off leak characteristics (refer to, for example, a patent document 1 (Japanese Unexamined Patent Publication No. 2001-267577 (see from the paragraph 0005 in page 2 to the paragraph 0013 in page 3 and FIG. 1)).

However, the above prior art is accompanied by a problem that since the nMOS element is formed in the monocrystal silicon layer directly formed in the sapphire substrate, compressive stress incident to epitaxial growth of silicon on the monocrystal silicon layer and the sapphire substrate occurs in the monocrystal silicon layer and hence the mobility of electrons moved through a channel formed in a channel region formed in the monocrystal silicon layer as the P type diffusion layer is decreased so that an on current is reduced, thereby degrading transistor characteristics.

SUMMARY OF THE INVENTION

The present invention has been made to solve the above problem. It is therefore an object of the present invention to provide a means that increases an on current of an nMOS element formed in a semiconductor device using an SOS substrate.

In order to attain the above object, the present invention provides a semiconductor device in which a MOSFET (MOS Field Effect Transistor) is formed in a monocrystal silicon layer of an SOS substrate in which a monocrystal silicon layer is laminated on a sapphire substrate, wherein an insulating film layer is formed between a channel region of the MOSFET and the sapphire substrate.

Thus, the present invention can bring about advantageous effects in that a compressive stress state of a channel region of an nMOS element can be canceled and a channel can be formed in a silicon crystal layer placed in a tensile stress state, and the mobility of electrons moved through the channel of the nMOS element formed in an SOS substrate can be enhanced so that an on current is increased, thus making it possible to enhance transistor characteristics.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of a semiconductor device according to the present invention will hereinafter be explained with reference to the accompanying figures.

First Preferred Embodiment

Figure 1:
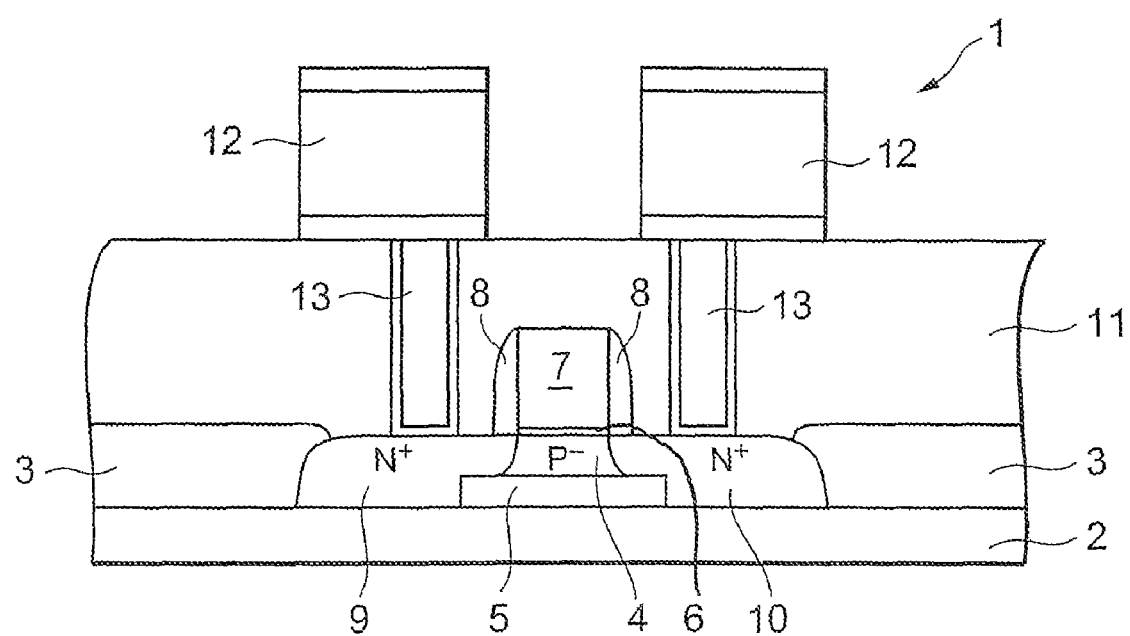
FIG. 1 is an explanatory view showing an nMOS element of a semiconductor device according to a first embodiment of the present invention.

FIG. 1 is an explanatory view showing an nMOS element of a semiconductor device according to a first embodiment of the present invention, and FIGS. 2A through 2D are explanatory views showing a process for manufacturing a silicon crystal layer of the semiconductor device according to the first embodiment.

Referring to FIG. 1, reference numeral 1 indicates a kind of nMOS element of a MOSFET (MOS Field Effect Transistor) formed in the semiconductor device.

The nMOS element 1 according to the present embodiment comprises a channel region 4 that is formed in a region surrounded by a field oxide film 3 constituted of a silicon oxide film ($SiO_2$) or the like, which is formed on a sapphire substrate 2 of an SOS substrate to insulate and separate between elements, and that is formed, as a P type diffusion layer, in a silicon crystal layer 25 to be described later on an insulating film layer 5 comprised of the silicon oxide film selectively formed in the channel region 4 corresponding to a region in which a channel of the nMOS element 1 is formed; a gate electrode 7 opposite to the channel region 4 with a gate oxide film 6 constituted of the silicon oxide film or the like being interposed therebetween; sidewalls 8 constituted of the silicon oxide film or the like, which are formed on their corresponding side faces of the gate electrode 7, a source region 9 and a drain region 10 each formed, as an N type diffusion layer, in an epitaxial layer 20 to be described later corresponding to a monocrystal silicon layer adjacent to the channel region 4, and contacts 13 which are buried in an intermediate insulating layer 11 constituted of the silicon oxide film or the like and connect the source region 9 and the drain region 10 and wirings 12 respectively. The nMOS element is electrically connected to other elements or terminals or the like through the wirings 12 to control current that flows through the channel formed in the channel region 4 between the source region 9 and the drain region 10 in accordance with a potential applied to the gate electrode 7.

Thus, the insulating film layer 5 employed in the present embodiment is formed between the channel region 4 and the sapphire substrate 2 located beneath the channel region 4.

A method for manufacturing a silicon crystal layer that forms a channel region of the semiconductor device according to the present embodiment in accordance with process steps shown in the figures will be explained below using FIGS. 2A through 2D.

Figure 2A:
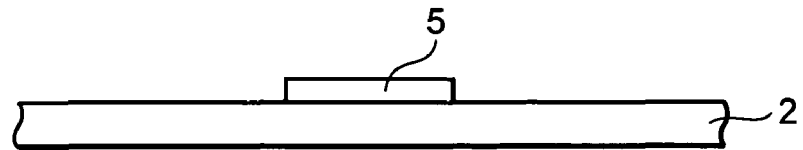
FIGS. 2A through 2D are explanatory views showing a process for manufacturing a silicon crystal layer of the semiconductor device according to the first embodiment.

As shown in FIG. 2A, a silicon oxide film having a thin thickness (ranging from 2 to 100 nm, for example) is formed on a sapphire substrate 2 by a CVD (Chemical Vapor Deposition) method. The formed silicon oxide film is patterned by photolithography and a region for forming a channel region 4 of an nMOS element 1 is masked. Then the silicon oxide film is removed by etching to selectively form an insulating film layer 5 formed of the silicon oxide film.

Figure 2B:
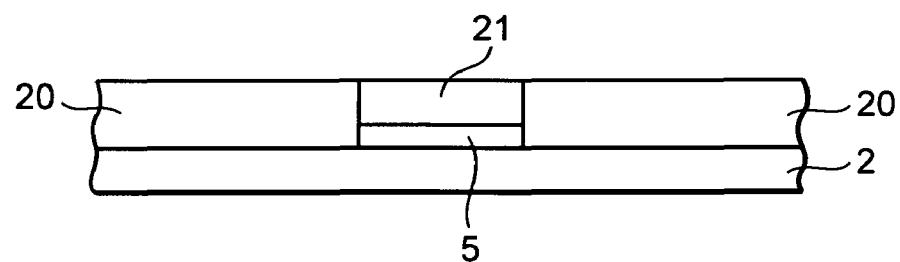

As shown in FIG. 2B, the mask lying on the insulating film layer 5 is removed and the entire substrate is heated in an atmosphere of $SiH_4$ gas (at 700° C.-1000° C., for example) to form an epitaxial layer 20 corresponding to a monocrystal silicon layer.

While, in this case, a region other than the region formed with the insulating film layer 5 on the sapphire substrate 2 is being formed with a monocrystal silicon layer by epitaxial growth of silicon in the same manner as ordinary, the insulating film layer 5 inhibits the epitaxial growth on the insulating film layer 5, so that a polysilicon layer 21 constituted of polysilicon is formed.

Figure 2C:
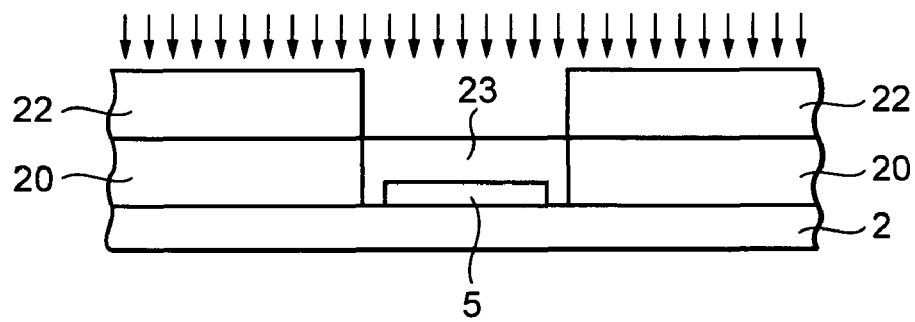

As shown in FIG. 2C, a mask layer formed on epitaxial layer 20 is patterned by photolithography to form a mask 22 that exposes the polysilicon layer 21 and part of the epitaxial layer 20 adjacent to the polysilicon layer 21. Then, silicon is ion-implanted therein (for example, $10^{13}$-$10^{16}$ ions/cm$^2$) to amorphize the polysilicon layer 21 and part of the epitaxial layer 20 adjacent thereto, whereby an amorphous region 23 is formed.

Figure 2D:
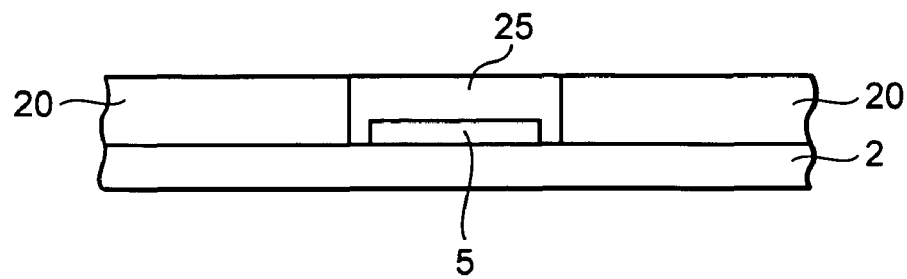

As shown in FIG. 2D, the mask 22 is removed after the formation of the amorphous region 23 and high-temperature heat treatment (at 600° C. to 1400° C., for example) is done in an atmosphere of an inert gas such as nitrogen, argon or the like to form a silicon crystal layer 25.

At this time, the amorphous region 23 is monocrystallized by solid phase epitaxial growth in the transverse direction from each adjacent portion of the epitaxial layer 20 corresponding to the monocrystal silicon layer adjacent to the amorphous region 23 so that the silicon crystal layer 25 formed of monocrystal silicon is formed.

The silicon crystal layer 25 formed in this way is brought to a tensile stress state.

That is, the epitaxial growth of silicon at the formation of the epitaxial layer 20 in the process step shown in FIG. 2B proceeds with origination with aluminum atoms that exist in crystal lattices of portions adjacent to the epitaxial layer 20 on the sapphire substrate 2 corresponding to monocrystal sapphire. Therefore, compressive stress occurs in the epitaxial layer 20 corresponding to the epitaxially-grown thin silicon layer due to the difference in lattice constant between crystal structures of the monocrystal silicon and the monocrystal sapphire, i.e., the fact that the lattice constant of sapphire is small. Thus, the silicon crystal layer 25 adjacent thereto is tensioned to reach a tensile stress state.

Thereafter, a field oxide film 3 used for insulation and separation between elements, a channel of the silicon crystal layer 25, a gate oxide film 6, a gate electrode 7, a source region 9 and a drain region 10 of the epitaxial layer 20, and contacts 13 that connect these and wirings 12 are formed in a manner similar to the normal nMOS element manufacturing process, whereby the nMOS element 1 of the semiconductor device according to the present embodiment shown in FIG. 1 is formed.

Incidentally, the high-temperature heat treatment described in the process step shown in FIG. 2D may be done in atmospheres such as an oxidative atmosphere, a hydrogen atmosphere, a vacuum atmosphere, etc.

In the present embodiment as described above, the insulating film layer is formed between the channel region of the nMOS element and the sapphire substrate placed beneath the channel region. Thus, it is possible to cancel the compressive stress state of the region formed with the channel and form the channel in the silicon crystal layer placed in the tensile stress state. Further, the mobility of electrons moved within the channel of the nMOS element formed in the SOS substrate can be enhanced and hence an on current is increased so that transistor characteristics can be enhanced.

The insulating film layer is selectively formed in the region in which the channel of the nMOS element on the sapphire substrate is formed. The epitaxial layer is formed in the region other than the region for the insulating film layer on the sapphire substrate, and the silicon layer is formed on the insulating film layer. Then, the silicon layer and part of the epitaxial layer adjacent thereto are amorphized by ion implantation. Thereafter, the silicon crystal layer corresponding to the monocrystal silicon is formed by the solid phase epitaxial growth in the transverse direction as viewed from the epitaxial layer. Consequently, the insulating film-like silicon layer can reliably be formed as the monocrystal silicon layer.

Second Preferred Embodiment

Figure 3:
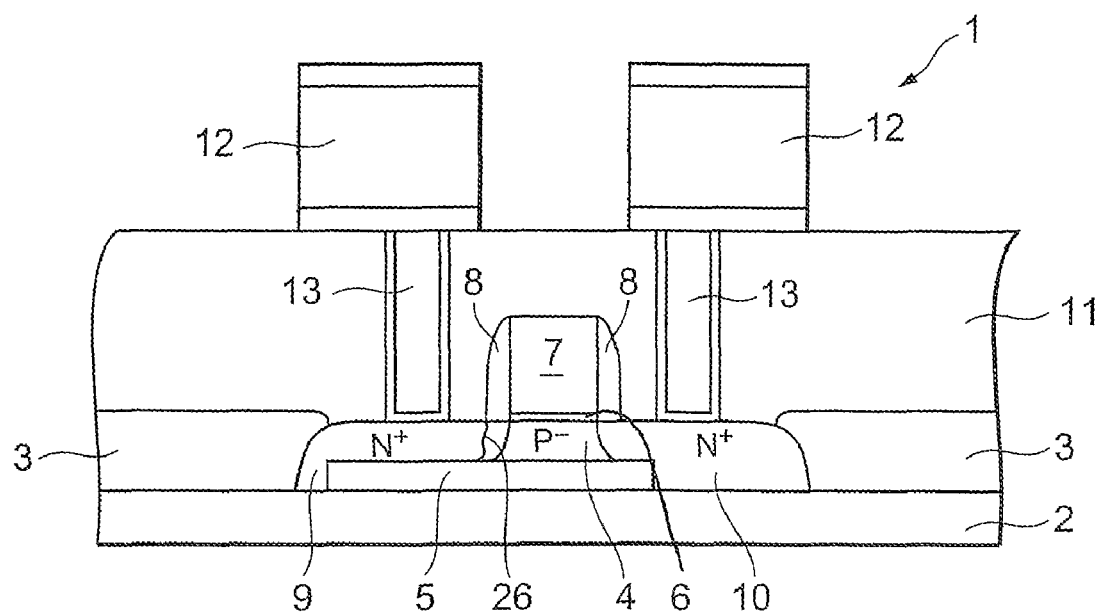
FIG. 3 is an explanatory view illustrating an nMOS element of a semiconductor device according to a second embodiment of the present invention.

FIG. 3 is an explanatory view showing an nMOS element of a semiconductor device according to a second embodiment of the present invention, and FIGS. 4A through 4D are explanatory views showing a process for manufacturing a silicon crystal layer of the semiconductor device according to the second embodiment.

Incidentally, portions similar to those employed in the first embodiment are given the same reference numerals and their description is omitted.

The nMOS element 1 according to the present embodiment is formed in a region surrounded by a field oxide film 3 formed on a sapphire substrate 2 of an SOS substrate in a manner similar to the first embodiment. An insulating film layer 5 extends from a channel region 4 of the nMOS element 1 to a region in which a source region 9 is formed, and is selectively formed. The channel region 4 formed as a P type diffusion layer and a source region 9 formed as an N type diffusion layer are formed in a silicon crystal layer 25 on the insulating film layer 5. The present embodiment is similar in other configuration to the first embodiment.

Thus, the insulating film layer 5 employed in the present embodiment is expanded from directly below the channel region 4 to directly below the source region 9 and formed between these and the sapphire substrate 2.

A method of manufacturing a silicon crystal layer that forms a channel region and a source region of the semiconductor device according to the present embodiment, will be described below using FIGS. 4A-4D.

Figure 4A:
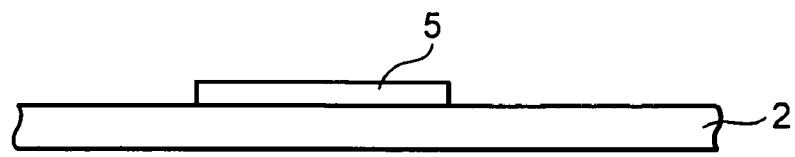
FIGS. 4A through 4D are explanatory views showing a process for manufacturing a silicon crystal layer of the semiconductor device according to the second embodiment.

As shown in FIG. 4A, a silicon oxide film is formed on a sapphire substrate 2 in a manner similar to the step shown in FIG. 2A of the first embodiment. The formed silicon oxide film is patterned by photolithography and regions for forming a channel region 4 and a source region 9 of an nMOS element 1 are masked. Then, the silicon oxide film is removed by etching to selectively form an insulating film layer 5 comprised of the silicon oxide film.

Figure 4B:
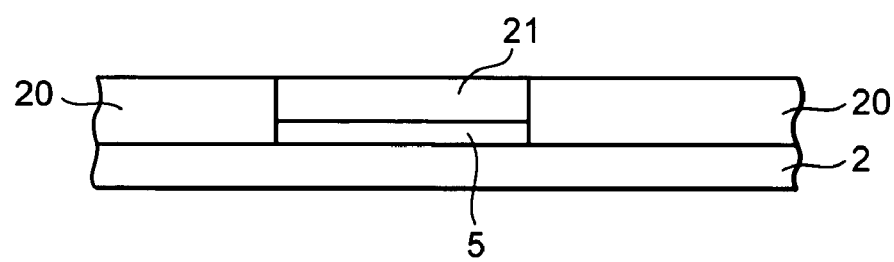

As shown in FIG. 4B, an epitaxial layer 20 is formed in a manner similar to the step shown in FIG. 2B of the first embodiment after the removal of the insulating film layer 5. In this case, a polysilicon layer 21 is formed in a manner similar to the step shown in FIG. 2B of the first embodiment.

Figure 4C:
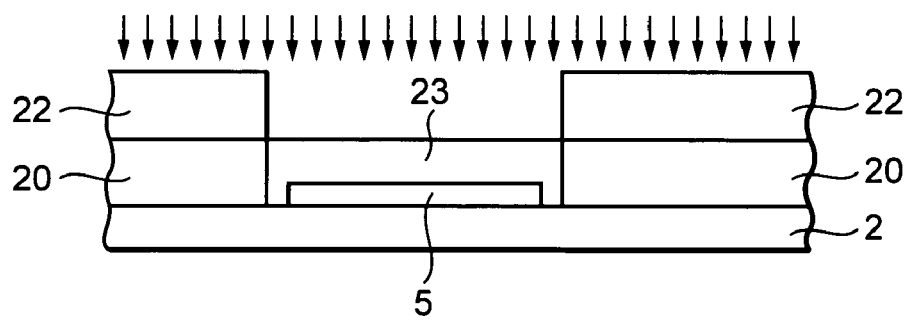

In a manner similar to the step shown in FIG. 2C of the first embodiment, as shown in FIG. 4C, a mask 22 is formed by photolithography with the polysilicon layer 21 and part of the epitaxial layer 20 adjacent thereto being exposed, and an amorphous region 23 is formed by ion implantation.

Figure 4D:
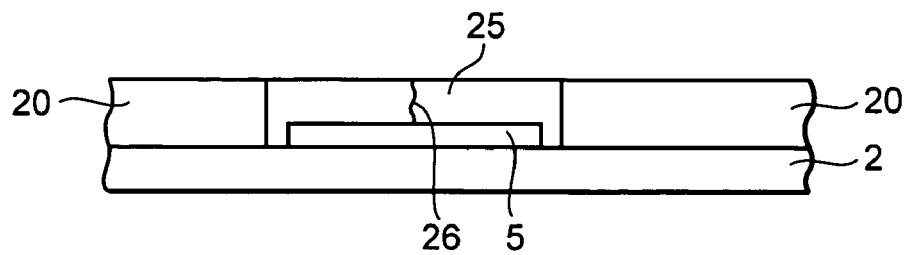

As shown in FIG. 4D, the amorphous region 23 is monocrystallized by high-temperature heat treatment in a manner similar to the step shown in FIG. 2D of the first embodiment to form a silicon crystal layer 25.

Since the epitaxial growth of silicon in the transverse direction as viewed from the epitaxial layer 20 adjacent thereto proceeds at the silicon crystal layer 25 formed in this way, the leading end of a growing crystal is abutted against a substantially central portion of the silicon crystal layer 25, i.e., it is abutted against the insulating film 5 at a substantially central portion thereof, where an abutting portion 26 is formed. A defect remains in the abutting portion 26.

Incidentally, the state of tensile stress of the silicon crystal layer 25 is formed in a manner similar to the first embodiment.

Thereafter, a field oxide film 3 used for insulation and separation between elements, a channel of the silicon crystal layer 25, a gate oxide film 6, a gate electrode 7, a source region 9 of the silicon crystal layer 25, a drain region 10 of the epitaxial layer 20, and contacts 13 that connect these and wirings 12 are formed in a manner similar to the normal nMOS element manufacturing process, whereby the nMOS element 1 of the semiconductor device according to the present embodiment shown in FIG. 3 is formed.

Thus, in the present embodiment, the insulating film layer 5 is formed so as to extend to the regions for forming the channel region 4 and the source region 9 by patterning in the step shown in FIG. 4A. It is therefore possible to shift the defect-existing abutting portion 26 of the silicon crystal layer 25 from the channel region 4.

In the present embodiment as described above, the insulating film layer is formed so as to extend from the channel region of the nMOS element to the region in which the source region is formed. Thus, in addition to effects similar to the first embodiment, the abutting portion formed in the silicon crystal layer can be shifted from the channel region, and the channel region of the silicon crystal layer is further reduced in defect as compared with the first embodiment, thus making it possible to further enhance the mobility of electrons moved through the channel.

Incidentally, although the present embodiment has described the extended side of the insulating film layer as the formed side of the source region, similar effects can be obtained even though the insulating film layer is expanded to the formed side of the drain region.

Although the respective embodiments respectively have described the case in which the insulating film layer is formed of the silicon oxide film, the insulating film layer is not limited to the silicon oxide film but may be of the silicon nitride film. Since the silicon nitride film has the property of applying tensile stress to a member adjacent thereto if done in this way, the tensile stress is added to the silicon crystal layer on the insulating film layer to produce a stronger tensile stress state, thereby making it possible to make higher the mobility of electrons moved through the channel.

Also although the respective embodiments respectively have described the MOSFET as the nMOS element, the formation of the MOSFET as a pMOS element is also similar to above.

Since a channel region in which a channel of the pMOS element is formed, is brought into a tensile stress state in this case, the diffusion of aluminum from the sapphire substrate can be perfectly suppressed by the insulating film layer although a rise in mobility of positive holes is hindered, thus making it possible to prevent the occurrence of an off leak current due to the diffusion of aluminum and hence stabilize transistor characteristics of the pMOS element.

Further, a CMOS structure in which the nMOS element and the pMOS element are combined with each other, may be formed in the SOS substrate. If done in this way, then the stabilization of characteristics of the CMOS structure can be achieved owing to the nMOS element and the pMOS element each having the stable characteristic.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method for manufacturing a semiconductor device wherein a MOSFET is formed in a monocrystal silicon layer of an SOS substrate in which the monocrystal silicon layer is laminated on a sapphire substrate, comprising:
   selectively forming an insulating film layer in a region for forming a channel of the MOSFET on the sapphire substrate;
   forming an epitaxial layer on the sapphire substrate in a region other than the insulating film layer, and forming a silicon layer on the insulating film layer;
   amorphizing the silicon layer and part of the epitaxial layer adjacent to the silicon layer by ion implantation to form an amorphous region within the epitaxial layer, the amorphous region having a top surface, a bottom surface opposite the top surface, and sidewalls extending between the bottom and top surfaces, the sidewalls adjoining with the epitaxial layer and the bottom surface is in direct contact with the sapphire substrate; and
   monocrystallizing the amorphous region by solid phase epitaxial growth from the epitaxial layer adjoining the sidewalls of the amorphous region, to form a silicon crystal layer under tensile stress from the epitaxial layer adjoining the sidewalls.

2. The method according to claim 1, wherein in said selectively forming an insulating film layer on the sapphire substrate, the insulating film layer is formed so as to extend from a region in which the channel of the MOSFET is formed, to either one of a source region and a drain region.

3. A method of manufacturing a semiconductor device comprising:
   depositing an insulation film on a sapphire substrate;
   epitaxially growing a first layer on the insulation film and on a surface of the sapphire substrate exposed by the insulation film, the first layer including a first region over the insulation film and a second region over the surface of the sapphire substrate, the first region is polycrystalline silicon and the second region is monocrystalline silicon;

forming a mask on the first layer, the mask having an opening that exposes the first region of the first layer and portions of the second region of the first layer adjacent the first region;

ion-implanting silicon into the opening of the mask to change the exposed first and second regions to an amorphous silicon region, the amorphous silicon region having a top surface and sidewalls, the sidewalls adjoining with the monocrystalline silicon of the second region;

carrying out heat treatment to change the amorphous silicon region to a monocrystalline silicon region by solid phase epitaxial growth from the second region adjoining the sidewalls of the amorphous silicon region; and forming a semiconductor device using the monocrystalline silicon region as a channel.

4. The method of manufacturing a semiconductor device of claim 3, wherein the insulation film comprises silicon oxide.

5. The method of manufacturing a semiconductor device of claim 3, wherein the insulation film comprises silicon nitride.

6. The method of manufacturing a semiconductor device of claim 3, wherein said forming a device comprises forming an n-type MOSFET wherein the channel is doped with p-type impurities.

7. The method of manufacturing a semiconductor device of claim 3, wherein said forming a device comprises forming a p-type MOSFET wherein the channel is doped with n-type impurities.

8. A method for manufacturing a semiconductor device, comprising:

selectively forming an insulating film layer in a region for forming a channel of a MOSFET on a sapphire substrate;

forming a monocrystalline epitaxial layer on the sapphire substrate in a region other than the insulating film layer, and forming a polysilicon layer on the insulating film layer;

amorphizing the polysilicon layer and part of the monocrystalline epitaxial layer adjacent to the polysilicon layer by ion implantation to form an amorphous pocket region, the amorphous pocket region in direct contact with both the insulating film layer and the sapphire substrate; and monocrystallizing the amorphous region by solid phase epitaxial growth from the monocrystalline epitaxial layer adjacent the amorphous pocket region to form a silicon crystal layer under tensile stress from the monocrystalline epitaxial layer adjacent thereto.

9. The method of manufacturing a semiconductor device of claim 8, wherein in said selectively forming an insulating film layer on the sapphire substrate, the insulating film layer is formed so as to extend from a region in which the channel of the MOSFET is formed, to either one of a source region and a drain region.

10. The method of manufacturing a semiconductor device of claim 8, wherein the insulating film layer comprises silicon oxide.

11. The method of manufacturing a semiconductor device of claim 8, wherein the insulating film layer comprises silicon nitride.

12. The method of manufacturing a semiconductor device of claim 8, wherein the MOSFET is an n-type MOSFET and the channel is doped with p-type impurities.

13. The method of manufacturing a semiconductor device of claim 8, wherein the MOSFET is p-type MOSFET and the channel is doped with n-type impurities.

\* \* \* \* \*